(12) United States Patent
Okayama et al.

(10) Patent No.: US 6,841,451 B2
(45) Date of Patent: Jan. 11, 2005

(54) METHOD OF FABRICATING SEMICONDUCTOR DEVICE HAVING ALIGNMENT MARK

(75) Inventors: Yoshio Okayama, Ogaki (JP); Keiichi Ueda, Gifu (JP); Satoru Shimada, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 315 days.

(21) Appl. No.: 10/103,997

(22) Filed: Mar. 25, 2002

(65) Prior Publication Data

US 2002/0142511 A1 Oct. 3, 2002

(30) Foreign Application Priority Data

Mar. 28, 2001 (JP) ........................................ 2001-091956

(51) Int. Cl.[7] .............................................. H01L 21/76
(52) U.S. Cl. ........................ 438/401; 438/462; 257/797
(58) Field of Search .......................... 438/14, 400, 401, 438/460–462; 257/618, 797

(56) References Cited

U.S. PATENT DOCUMENTS

| | | | |
|---|---|---|---|
| 6,259,525 B1 * | 7/2001 | David ........................... | 356/399 |
| 6,340,547 B1 * | 1/2002 | Chen et al. ..................... | 430/22 |
| 6,501,189 B1 * | 12/2002 | Kim et al. ...................... | 257/797 |
| 6,544,859 B2 * | 4/2003 | Ziger et al. .................... | 438/401 |
| 6,545,369 B1 * | 4/2003 | Hatab ............................ | 257/797 |
| 6,555,441 B2 * | 4/2003 | Ouellet ......................... | 438/401 |

FOREIGN PATENT DOCUMENTS

| | | |
|---|---|---|
| JP | 62-84516 | 4/1987 |
| JP | 8-181066 | 7/1996 |
| JP | 10-163286 | 6/1998 |
| JP | 11-54404 | 2/1999 |
| JP | 11-260883 | 9/1999 |

* cited by examiner

Primary Examiner—Duy-Vu Deo
(74) Attorney, Agent, or Firm—McDermott Will & Emery LLP (57) ABSTRACT

A method of fabricating a semiconductor device capable of remarkably reducing the quantity of misalignment after an etching step is obtained. This method of fabricating a semiconductor device comprises a first lithography step of transferring a mask pattern onto a first semiconductor substrate as a first resist pattern with positional reference to a first alignment mark, a first etching step of performing etching through the first resist pattern serving as a mask, a step of measuring the quantity of misalignment after the first etching step and a second lithography step of thereafter transferring the mask pattern onto a second semiconductor substrate as a second resist pattern while correcting the positional reference based on the first alignment mark on the basis of the quantity of misalignment after the first etching step. Thus, the positional reference in the second lithography step can be previously corrected to eliminate the quantity of misalignment after the etching step, whereby the quantity of misalignment after the second etching step is remarkably reduced.

14 Claims, 6 Drawing Sheets

```
ANALYZE FACTOR IN LITHOGRAPHY PROCESS    STEP 1
                ↓
ANALYZE FACTOR IN ETCHING PROCESS         STEP 2
                ↓
(ETCHING FACTOR)-(LITHOGRAPHY FACTOR)=QUANTITY OF E-L SHIFT    STEP 3
```

FIG.3

$$\begin{bmatrix} f_{XA} \\ f_{XB} \\ f_{XC} \end{bmatrix} = \begin{bmatrix} 1 & a_{XA} & a_{YA} \\ 1 & a_{XB} & a_{YB} \\ 1 & a_{XC} & a_{YC} \end{bmatrix} \begin{bmatrix} F_X \\ S_X \\ R_X \end{bmatrix} \quad \begin{bmatrix} f_{YA} \\ f_{YB} \\ f_{YC} \end{bmatrix} = \begin{bmatrix} 1 & a_{YA} & a_{XA} \\ 1 & a_{YB} & a_{XB} \\ 1 & a_{YC} & a_{XC} \end{bmatrix} \begin{bmatrix} F_Y \\ S_Y \\ -R_Y \end{bmatrix}$$

f:RESULT OF MEASURMENT OF ALIGNMENT MARK(QUANTITY OF MISALIGNMENT)
a:ALIGNMENT MARK COORDINATES
F:OFFSET, S:SCALING, R:ROTATION···FACTORS
X:X COMPONENT, Y:Y COMPONENT    A,B,C:THREE ALIGNMENT MARKS

FIG.4

$$\begin{bmatrix} F_X^{E-L} \\ S_X^{E-L} \\ R_X^{E-L} \end{bmatrix} \approx \begin{bmatrix} F_X^E \\ S_X^E \\ R_X^E \end{bmatrix} - \begin{bmatrix} F_X^L \\ S_X^L \\ R_X^L \end{bmatrix} \quad \begin{bmatrix} F_Y^{E-L} \\ S_Y^{E-L} \\ R_Y^{E-L} \end{bmatrix} \approx \begin{bmatrix} F_Y^E \\ S_Y^E \\ R_Y^E \end{bmatrix} - \begin{bmatrix} F_Y^L \\ S_Y^L \\ R_Y^L \end{bmatrix}$$

F:OFFSET, S:SCALING, R:ROTATION···FACTORS
X:X COMPONENT, Y:Y COMPONENT
E-L:QUANTITY OF E-L SHIFT, E:ETCHING FACTOR,
L:LITHOGRAPHY FACTOR

METHOD OF FABRICATING SEMICONDUCTOR DEVICE HAVING ALIGNMENT MARK

BACKGROUND OF THE INVENTION

1. Field of the Invention

The present invention relates to a method of fabricating a semiconductor device, and more particularly, it relates to a method of fabricating a semiconductor device having an alignment mark used in a lithography step.

2. Description of the Prior Art

Following improvement in integration of a recent semiconductor device, an exposure method of dividing a semiconductor substrate into some regions (shots) and transferring a mask pattern every shot is employed in a lithography step for fabricating the semiconductor device. In order to accurately superpose (align) a pattern on the semiconductor substrate and a pattern on a photomask with each other in this method, the position of an alignment mark formed on the semiconductor substrate must be correctly recognized.

In general, offset (shift), scaling (scale factor) and rotation are known as factors influencing alignment accuracy. Misalignment (misregistration) results from these factors. The term "offset" stands for such a phenomenon that the pattern on the mask is transferred in a state shifting from a reference position in directions X and Y with respect to the pattern on the substrate. The term "scaling" stands for such a phenomenon that the pattern on the mask is transferred in a state enlarged or reduced in size with respect to the pattern on the substrate. The term "rotation" stands for such a phenomenon that the pattern on the mask is transferred in a state rotated about the center of the shot with respect to the pattern on the substrate.

In general, various methods are proposed in order to correct the aforementioned misalignment, as disclosed in Japanese Patent Laying-Open No. 11-54404 (1999), for example.

Figure 9:
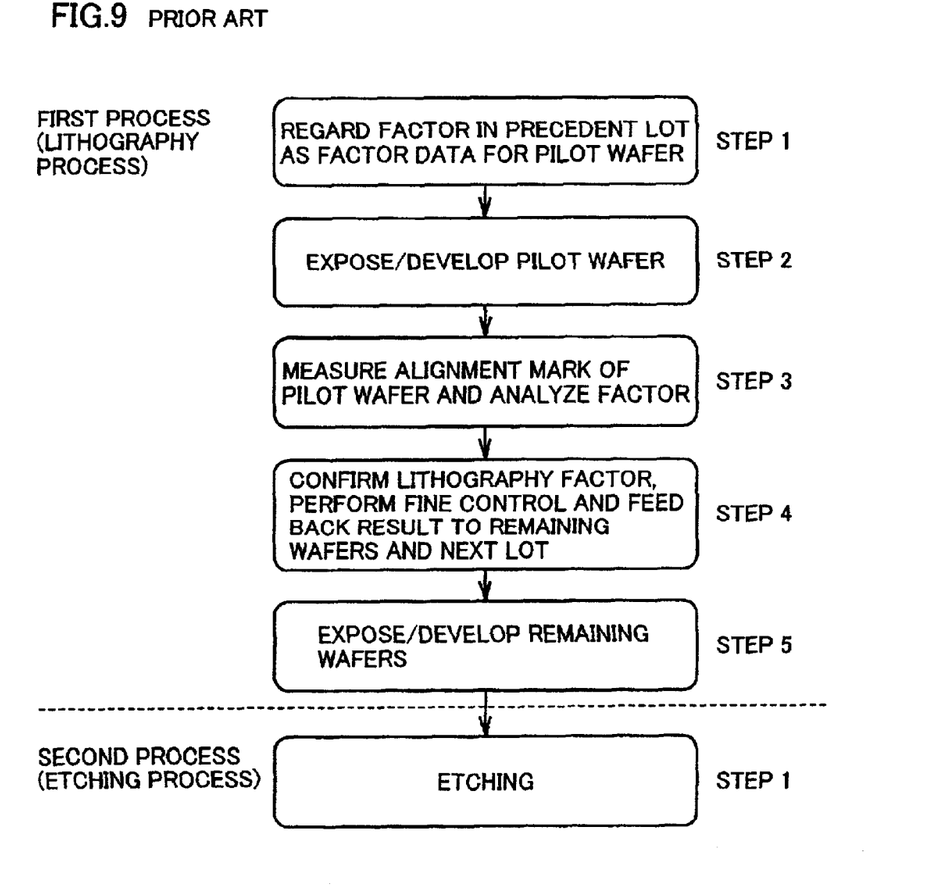
FIG. 9 is a flow chart showing a conventional method of correcting misalignment.

FIG. 9 is a flow chart for illustrating a conventional method of correcting misalignment. The conventional method of correcting misalignment is now described with reference to FIG. 9.

At a step 1 of a first process (lithography process), the result of analysis of a misalignment factor such as offset, scaling or rotation in a lithography process for a precedent lot is regarded as data for correcting a factor for a precedently processed (pilot) wafer of the current lot. The term "lot" stands for a constant quantity of semiconductor substrates collectively processed as a unit. Semiconductor substrates forming each lot are processed in each step of fabricating semiconductor devices basically at the same time or under the same conditions.

At a step 2 of the first process, the aforementioned data is input in an exposure apparatus for exposing/developing the pilot wafer with positional reference to a first alignment mark formed thereon. Thus, a resist pattern for forming a semiconductor element pattern and a resist pattern for forming a second alignment mark are formed at the same time.

At a step 3 of the first process, the first alignment mark of the pilot wafer is measured for analyzing the factor for misalignment in the lithography process for the pilot wafer.

At a step 4 of the first process, the result of analysis of the factor for the pilot wafer is confirmed and the aforementioned data is finely controlled to reduce the quantity of misalignment in the lithography process. The finely controlled data is employed as factor correction data for the remaining wafers and the next lot.

At a step 5 of the first process, the aforementioned finely controlled data is input in the exposure apparatus, for thereafter exposing/developing the remaining wafers.

At a step 1 of a second process (etching process) succeeding the first process (lithography process), etching is performed through a resist pattern serving as a mask, thereby forming the semiconductor element pattern and the second alignment mark on the semiconductor substrate.

According to the conventional method of correcting misalignment shown in FIG. 9, the quantity of misalignment can be reduced after the lithography process by feeding back the factor data in the lithography process.

In the conventional method, however, it may be difficult to reduce the quantity of misalignment after the subsequent etching process. FIGS. 10 to 13 are diagrams showing sections and partial planes in the fabrication process for illustrating the problem of the conventional method of correcting misalignment.

Figure 10:
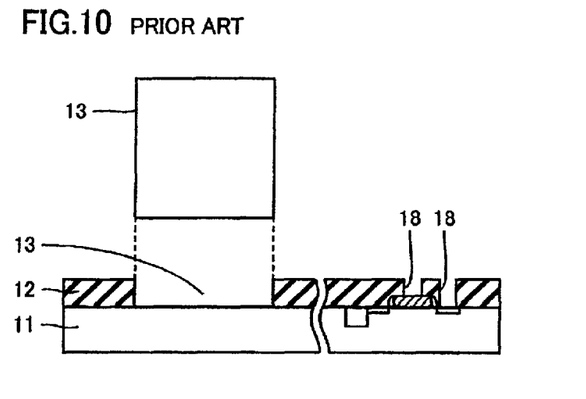
FIGS. 10 to 13 are diagrams showing sections and partial planes in the fabrication process for illustrating the problem of the conventional method of correcting misalignment.

The problem of the conventional method of correcting misalignment is now described with reference to FIGS. 10 to 13. In the conventional process of fabricating a semiconductor device, lower semiconductor element patterns 18 and a first alignment mark 13 are simultaneously formed on a silicon oxide film 12 deposited on a silicon substrate 11, as shown in FIG. 10. The first alignment mark 13 is a reference box (outer box) of a box-in-box alignment mark, for example.

Figure 11:
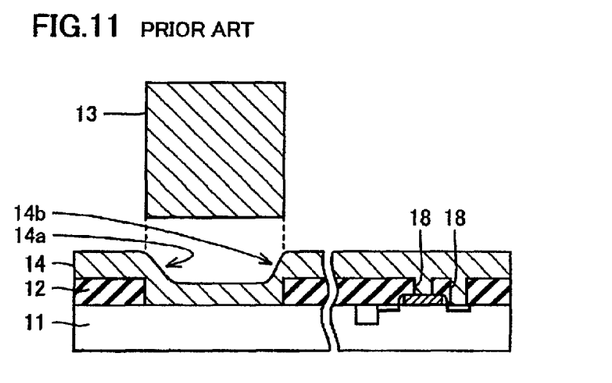

Thereafter an Al alloy film 14 is formed by sputtering, as shown in FIG. 11. When the Al alloy film 14 is formed by sputtering, the movement of atoms emitted from a target consisting of an Al alloy by sputtering has a directional property. More specifically, there is a high possibility that atoms emitted from a target located on the center of the wafer arrive at ends of the wafer from a constant oblique direction. On the side walls of the first alignment mark 13 consisting of an opening, therefore, the Al alloy film 14 grows at different rates, to result in parts 14a and 14b having different thicknesses. Consequently, the Al alloy film 14 is asymmetrically formed.

Then, a resist pattern 15a for forming an alignment mark and resist patterns 15b for forming semiconductor element patterns are formed on prescribed regions of the Al alloy film 14 by transferring a mask pattern 100. The resist pattern 15a is a mask pattern for forming a superposition box (inner box) of the box-in-box alignment mark, for example. In the lithography process shown in FIG. 12, the position of the first alignment mark 13 is detected with diffracted light of a laser beam or the like, in order to align the resist patterns 15a and 15b and the lower semiconductor element patterns 18 with each other. In this case, a detected position 16 of the first alignment mark 13 shifts rightward from the original position of the first alignment mark 13 due to the aforementioned asymmetry of the Al alloy film 14.

In this state, the steps 1 to 5 of the first process of the method of correcting misalignment shown in FIG. 9 are generally applied for accurately aligning the resist pattern 15a with the detected position 16 of the first alignment mark 13. Consequently, sizes a2 and b2 shown in FIG. 12 are substantially equalized with each other.

Figure 12:
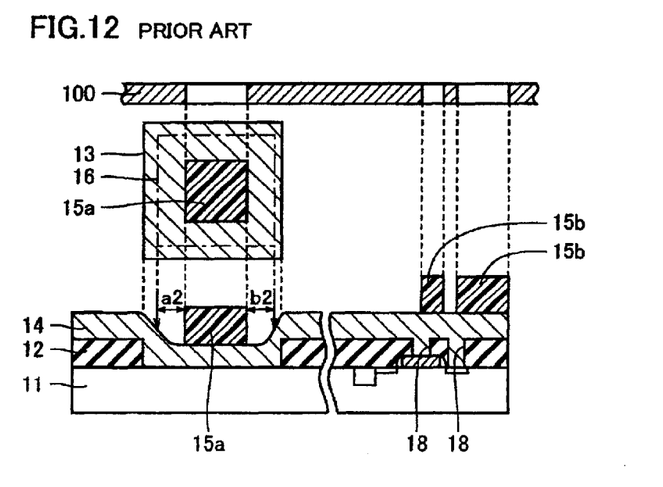
Figure 13:
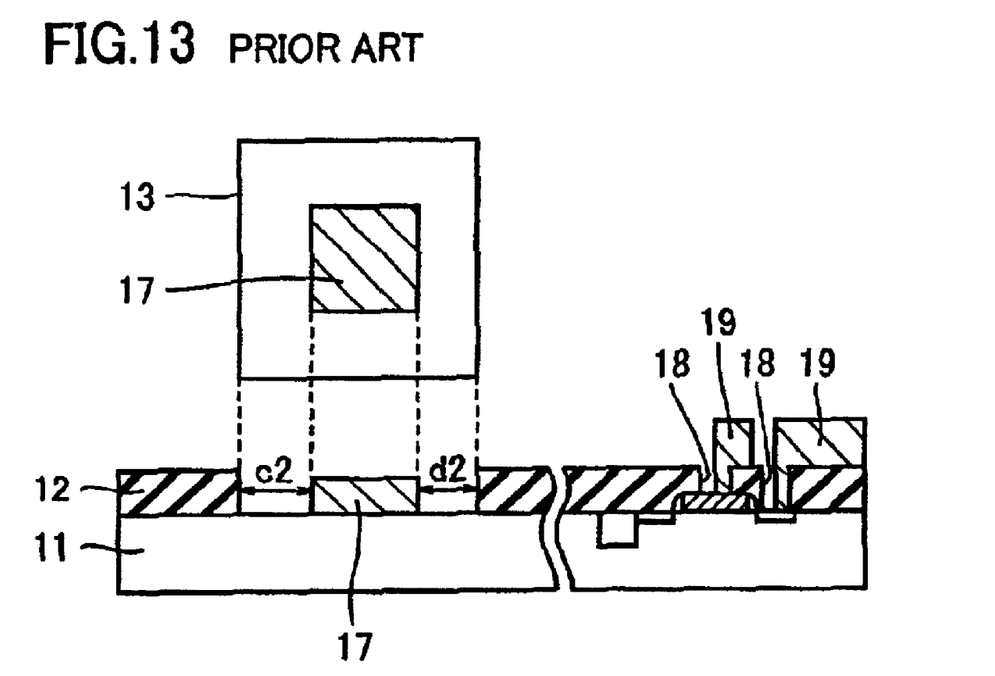

Then, the resist patterns 15a and 15b formed in the lithography process shown in FIG. 12 are employed as masks for etching the Al alloy film 14, thereby forming upper semiconductor element patterns 19 and a second alignment mark 17 as shown in FIG. 13.

However, the detected position 16 of the first alignment mark 13 shifts rightward from the actual first alignment mark 13 in the lithography process shown in FIG. 12, and hence the second alignment mark 17 formed with positional reference to the detected position 16 also shifts rightward with respect to the first alignment mark 13. In other words, sizes c2 and d2 are not equalized with each other.

Therefore, the upper semiconductor element patterns 19 shift rightward with respect to the lower semiconductor element patterns 18, to result in inconvenience such as defective conduction. Consequently, the semiconductor device is disadvantageously deteriorated in characteristic and reduced in yield.

SUMMARY OF THE INVENTION

An object of the present invention is to provide a method of fabricating a semiconductor device capable of reducing the quantity of misalignment after an etching step.

Another object of the present invention is to simplify factor analysis and correction of positional reference in the aforementioned method of fabricating a semiconductor device.

A method of fabricating a semiconductor device according to an aspect of the present invention comprises a first lithography step of transferring a mask pattern onto a first semiconductor substrate as a first resist pattern with positional reference to a first alignment mark, a first etching step of performing etching through the first resist pattern serving as a mask, a step of measuring the quantity of misalignment after the first etching step and a second lithography step of thereafter transferring the mask pattern onto a second semiconductor substrate as a second resist pattern while correcting the positional reference based on the first alignment mark on the basis of the quantity of misalignment after the first etching step.

In the method of fabricating a semiconductor device according to this aspect, the positional reference based on the first alignment mark is corrected on the basis of the quantity of misalignment after the first etching step for transferring the mask pattern onto the second semiconductor substrate as the second resist pattern, whereby the positional reference in the second lithography step can be previously corrected to eliminate the quantity of misalignment after the etching step, and hence the quantity of misalignment can be remarkably reduced after the second etching step.

The method of fabricating a semiconductor device according to the aforementioned aspect preferably further comprises a second etching step of performing etching through the second resist pattern serving as a mask. According to this structure, etching is performed on the basis of the second resist pattern formed in consideration of the quantity of misalignment after the first etching step, whereby the quantity of misalignment can be readily reduced after the second etching step.

In the method of fabricating a semiconductor device according to the aforementioned aspect, the first etching step preferably includes a step of forming a second alignment mark by etching, and the step of measuring the quantity of misalignment after the first etching step preferably includes a step of measuring the quantity of misalignment between the first alignment mark and the second alignment mark after the first etching step. According to this structure, the quantity of misalignment can be readily measured after the first etching step. In this case, the step of measuring the quantity of misalignment after the first etching step preferably includes steps of analyzing the factor for the quantity of misalignment in the first lithography step, analyzing the factor for the quantity of misalignment in the first etching step and calculating the quantity of misalignment after the first etching step by obtaining the difference between the factor for the quantity of misalignment in the first etching step and the factor for the quantity of misalignment in the first lithography step. According to this structure, the quantity of misalignment can be readily measured after the first etching step. In this case, the factor for the quantity of misalignment may include at least one of offset, scaling and rotation.

In the method of fabricating a semiconductor device according to the aforementioned aspect, the second lithography step preferably includes a step of transferring the mask pattern onto a second semiconductor substrate as a second resist pattern while regularly setting the quantity of misalignment after the first etching step constant and correcting the positional reference based on the first alignment mark. According to this structure, neither factor analysis nor correction of the positional reference based on the first alignment mark may be performed every lot, whereby productivity can be improved.

In the method of fabricating a semiconductor device according to the aforementioned aspect, the second lithography step preferably includes a step of correcting the positional reference based on the first alignment mark while regarding offset and scaling as the factors for the quantity of misalignment after the first etching step. According to this structure, the factors for the quantity of misalignment after the first etching step can be limited to offset and scaling remarkably influencing misalignment, whereby factor analysis and correction of positional reference based on the first alignment mark can be simplified without substantially reducing alignment accuracy.

In the method of fabricating a semiconductor device according to the aforementioned aspect, the second lithography step preferably includes a step of correcting the positional reference based on the first alignment mark while regarding scaling as the factor for the quantity of misalignment after the first etching step. According to this structure, the factor for the quantity of misalignment after the first etching step can be limited to scaling remarkably influencing misalignment, whereby factor analysis and correction of positional reference based on the first alignment mark can be simplified without substantially reducing alignment accuracy.

In the method of fabricating a semiconductor device according to the aforementioned aspect, the second lithography step preferably includes a step of correcting the positional reference based on the first alignment mark while regarding offset as the factor for the quantity of misalignment after the first etching step. According to this structure, the factor for the quantity of misalignment after the first etching step can be limited to offset remarkably influencing misalignment, whereby factor analysis and correction of positional reference based on the first alignment mark can be simplified without substantially reducing alignment accuracy.

The method of fabricating a semiconductor device according to the aforementioned aspect preferably further comprises a step of forming a metal layer to cover the first alignment mark in advance of the first lithography step, and the first lithography step preferably includes a step of transferring the mask pattern onto the metal layer as the first resist pattern. When the first resist pattern is formed on the metal layer, the position of the first alignment mark may shift when the same is detected with reference to the metal layer. Also when the detected position of the first alignment mark shifts, however, the quantity of misalignment in the etching step is previously corrected in the lithography step according to the present invention, to result in no problem. In the aforementioned structure, the step of forming the metal layer may include a step of forming an asymmetrical metal layer by sputtering.

In the method of fabricating a semiconductor device according to the aforementioned aspect, the second lithography step preferably includes a step of forming the second resist pattern on a region formed with the first alignment mark, and the second etching step preferably includes a step of forming a second alignment mark by performing etching through the second resist pattern serving as a mask. According to this structure, the first and second alignment marks can be formed in superposition with each other. Thus, a box-in-box alignment mark, for example, can be readily formed.

In the method of fabricating a semiconductor device according to the aforementioned aspect, the first lithography step and the first etching step are preferably carried out in a first lot, and the second lithography step is preferably carried out in a second lot following the first lot. According to this structure, the second lithography step in the second lot can be carried out in consideration of the quantity of misalignment after the first etching step in the first lot, whereby the quantity of misalignment can be reduced after the second etching step in the second lot.

In the method of fabricating a semiconductor device according to the aforementioned aspect, the first lithography step and the first etching step are preferably carried out on a pilot wafer for preprocessing, and the second lithography step is preferably carried out in a first lot. According to this structure, the second lithography step in the first lot can be carried out in consideration of the quantity of misalignment after the first etching step in the previously processed pilot wafer, whereby the quantity of misalignment can be reduced after the second etching step of the first lot.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described with reference to the drawings.

A method of correcting misalignment according to the embodiment of the present invention is described with reference to FIGS. 1 and 2.

Figure 1:
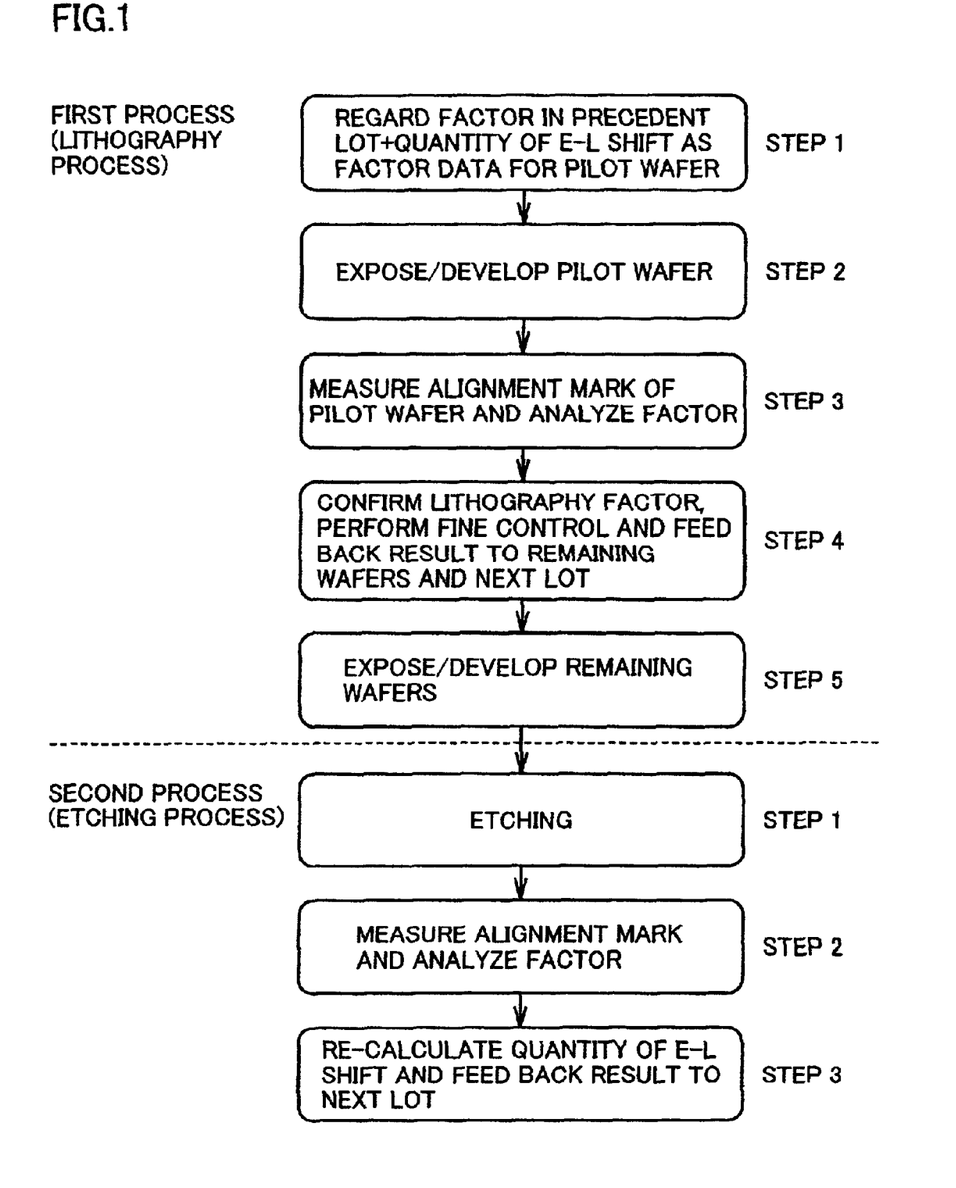
FIG. 1 is a flow chart showing a method of correcting misalignment according to an embodiment of the present invention.
Figure 2:
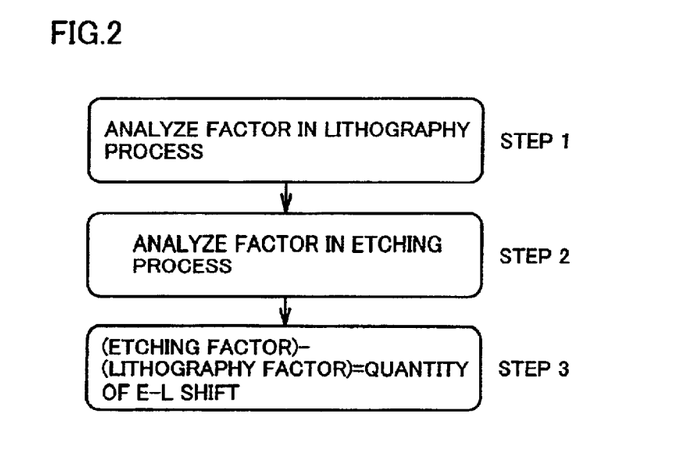
FIG. 2 is a flow chart showing a procedure of deciding the quantity of shift (E-L shift) between an etching process and a lithography process according to the embodiment of the present invention.

According to this embodiment, a value obtained by adding the quantity of shift (hereinafter referred to as the quantity of E-L shift) between an etching process and a lithography process to a factor for misalignment in a lithography process of a precedently processed lot is regarded as factor data for a pilot wafer of a current lot at a step 1 of a first process (lithography process), as shown in FIG. 1. In order to decide the quantity of E-L shift, alignment marks are measured after the lithography process at a step 1 shown in FIG. 2 thereby executing factor analysis of the quantity of misalignment in the lithography step. Then, the etching process is carried out and thereafter the same alignment marks as those in the lithography step are measured at a step 2 shown in FIG. 2, thereby executing factor analysis of the quantity of misalignment. At a step 3 shown in FIG. 2, the difference between the respective factors is obtained from the results of factor analysis after the etching process and the lithography process. The difference between the respective factors is regarded as the quantity of E-L shift.

Figure 3:
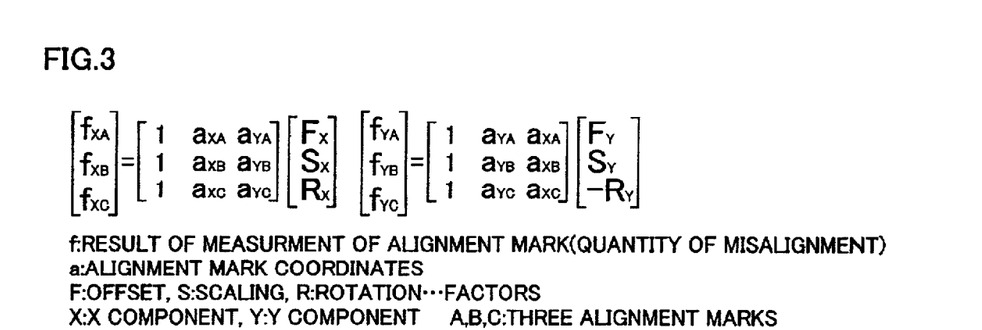
FIGS. 3 and 4 illustrate numerical formulas employed for a method of calculating the quantity of E-L shift according to the embodiment of the present invention.

FIG. 3 illustrates numerical formulas showing the relation between three factors, i.e., offset, scaling and rotation and results of measurement (quantities of misalignment) of three alignment marks arranged on different positions in a shot. These numerical formulas are disclosed in the aforementioned Japanese Patent Laying-Open No. 11-54404, for example. A factor such as offset can be obtained from the results of alignment measurement through the numerical formulas shown in FIG. 3. However, measurement errors are present in practice and hence statistic calculation is performed with reference to at least four alignment marks.

Figure 4:
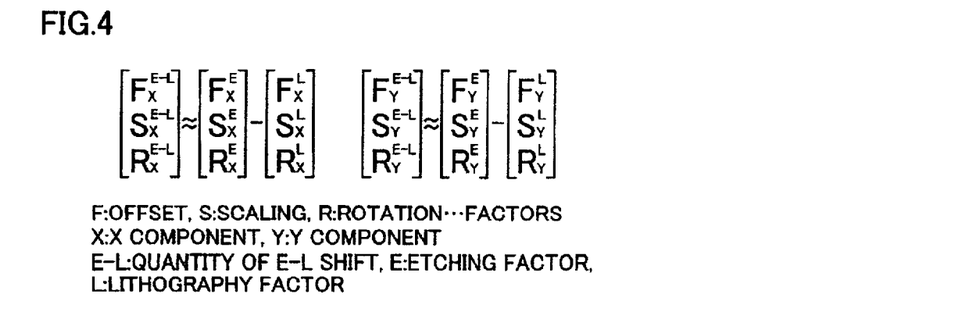

In order to obtain the quantity of E-L shift from the factors obtained after etching and after lithography, numerical formulas shown in FIG. 4 are employed. Correctly, secondary terms of the respective factors are present. However, all three factors, generally small values of about $10^{-6}$, can be approximately calculated through the numerical formulas shown in FIG. 4. The formulas shown in FIG. 4 are specific to the present invention.

After the step 1 of the first process (lithography process) shown in FIG. 1, factor data of the aforementioned pilot wafer of the current lot is input in an exposure apparatus at a step 2, for thereafter performing exposure/development. Thus, a resist pattern for forming semiconductor element patterns and a resist pattern for forming alignment marks are simultaneously formed.

Then, the alignment marks of the pilot wafer are measured at a step 3 of the first process, thereby performing factor analysis of the quantity of misalignment in the lithography process for the pilot wafer.

Then, the result of the factor analysis on the pilot wafer is confirmed at a step 4 of the first process. This result of factor analysis theoretically completely cancels the quantity of E-L shift. When there is an error, the factors in the lithography process are finely controlled to cancel the error and the finely controlled data are regarded as factor correction data for the remaining wafers and the next lot.

Then, the finely controlled data are input in the exposure apparatus at a step 5 of the first process, followed by exposure/development on the remaining wafers.

The steps 2 to 5 of the first process in this embodiment are basically similar to the steps 1 to 5 of the first process in the conventional method of correcting misalignment shown in FIG. 9.

At a step 1 of a second process (etching process), etching is performed through the resist patterns serving as masks, thereby forming the semiconductor element patterns and the alignment marks on the semiconductor substrate.

Thereafter the alignment marks after etching are measured at a step S2 of the second process, for thereafter confirming that the quantity of misalignment is not more than 50 nm. Further, factor analysis for the quantity of misalignment is performed.

At a step 3 of the second process, the quantity of E-L shift is recalculated from the result of factor analysis after etching. The recalculated quantity of E-L shift is applied to the next lot subjected to the same processing (lithography and etching processes).

A process of forming semiconductor element patterns and alignment marks with application of the aforementioned method of correcting misalignment according to this embodiment is now described with reference to FIGS. 5 to 8.

Figure 5:
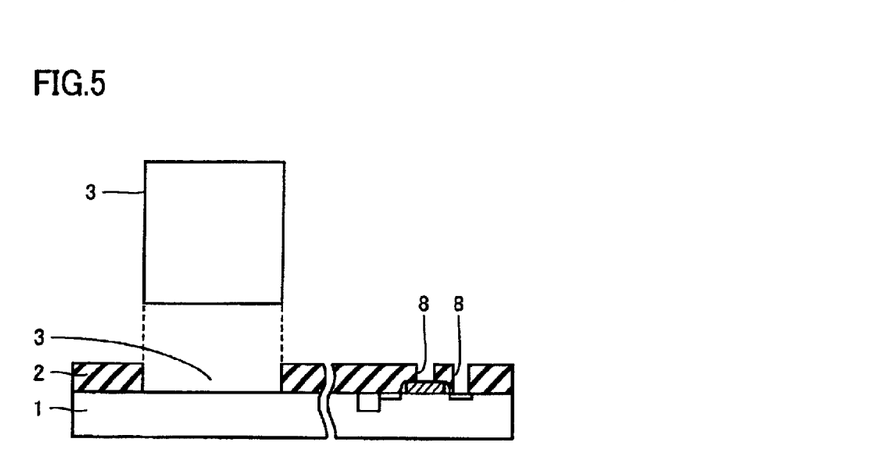
FIGS. 5 to 8 illustrate sections and partial planes in a process of fabricating semiconductor element patterns and alignment marks with application of the method of correcting misalignment according to the embodiment of the present invention.
Figure 6:
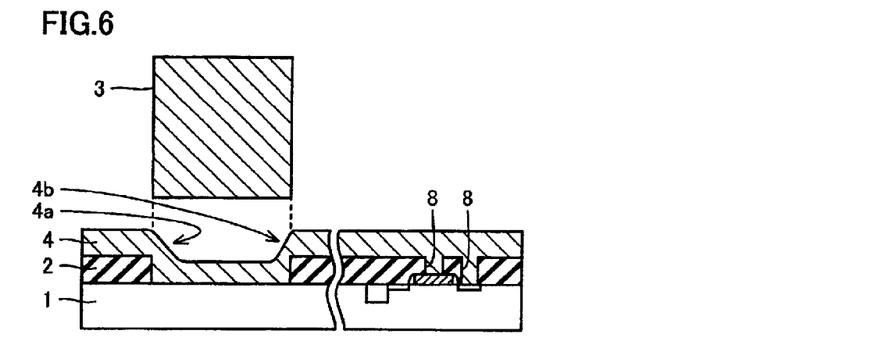

First, lower semiconductor element patterns 8 and a first alignment mark 3 are simultaneously formed in a silicon oxide film 2 deposited on a silicon substrate 1, as shown in FIG. 5. Then, an Al alloy film 4 is formed by sputtering, as shown in FIG. 6. In this case, parts 4a and 4b of the Al alloy film 4 have different thicknesses due to asymmetry of the film deposited by sputtering.

Figure 7:
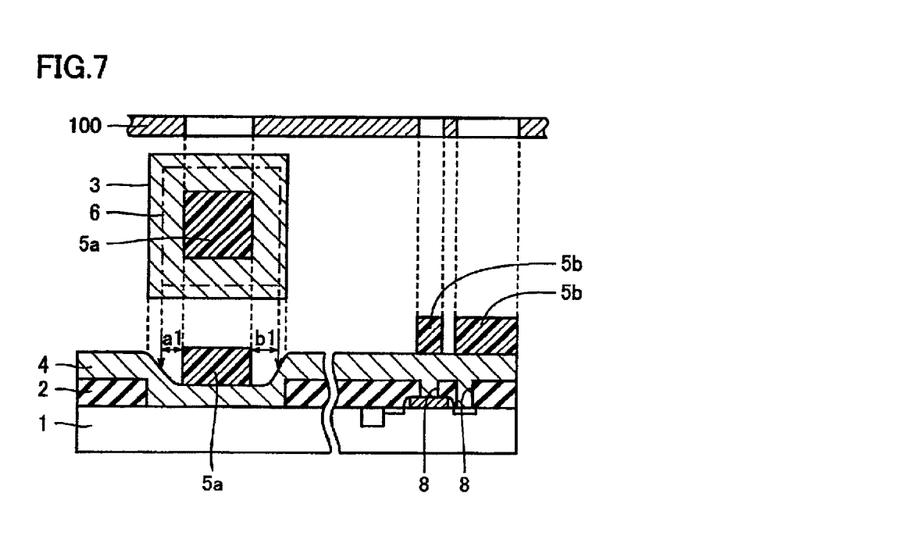

Then, a resist pattern 5a for forming a second alignment mark 7 (see FIG. 8) and resist patterns 5b for forming upper semiconductor element patterns 9 (see FIG. 8) are formed on the Al alloy film 4 by transferring a mask pattern 100, as shown in FIG. 7.

According to this embodiment, alignment (registration) is performed in the lithography process shown in FIG. 7 in consideration of the quantity of E-L shift in a lot previously subjected to the same processing, as shown at the step 1 of the first process shown in FIG. 1. A detected position 6 of the first alignment mark 3 shifts rightward in the lithography process shown in FIG. 7 due to the asymmetry of the Al alloy film 4 shown in FIG. 6. According to this embodiment, the resist patterns 5a and 5b are formed to shift leftward with respect to the detected position 6 in consideration of the quantity of E-L shift in the precedent lot. In this case, sizes a1 and b1 between the detected position 6 and the resist pattern 5a are not equalized with each other.

Figure 8:
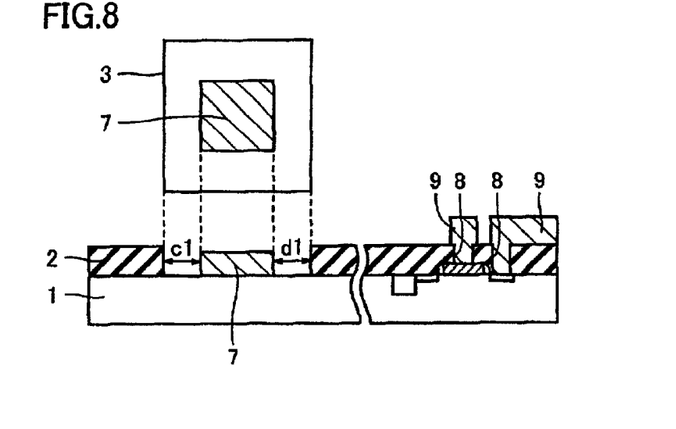

Then, the resist patterns 5a and 5b formed in the lithography process are employed as masks for etching the Al alloy film 4 thereby forming a second alignment mark 7 and upper semiconductor element patterns 9 consisting of the Al alloy film 4, as shown in FIG. 8. According to this embodiment, connection plugs for the lower semiconductor element patterns 8 and the upper semiconductor element patterns 9 are formed at the same time.

According to this embodiment, alignment is previously performed in the lithography process in consideration of the quantity of E-L shift, whereby the second alignment mark 7 hardly shifts from the first alignment mark 3. In other words, sizes c1 and d1 showing displacement between the first and second alignment marks 3 and 7 are substantially equal to each other in FIG. 8. Thus, the quantity of misalignment can be remarkably reduced, thereby effectively preventing the semiconductor device from deterioration in characteristic and reduction in yield resulting from defective conduction or the like.

According to this embodiment, positional reference based on the first alignment mark 3 is corrected on the basis of the quantity of previous misalignment between the first alignment mark 3 and the second alignment mark 7 for transferring the mask pattern 100 as the resist patterns 5a and 5b, whereby correction can be previously made in the lithography process for eliminating the quantity of misalignment between the first and second alignment marks 3 and 7 after the etching process. Consequently, the quantity of misalignment between the first and second alignment marks 3 and 7 can be remarkably reduced after the etching process.

Although the present invention has been described and illustrated in detail, it is clearly understood that the same is by way of illustration and example only and is not to be taken by way of limitation, the spirit and scope of the present invention being limited only by the terms of the appended claims.

For example, while the quantity of E-L shift in the precedent lot is reflected to the lithography process in the current lot in the aforementioned embodiment, the present invention is not restricted to this but the quantity of E-L shift may alternatively be regularly set constant for correcting the lithography process. Thus, neither factor analysis nor numerical input in the exposure apparatus may be performed every lot, whereby the throughput (productivity) can be improved.

While the factor analysis is performed on the assumption that the factors for the quantity of E-L shift include offset, scaling and rotation in the aforementioned embodiment, the present invention is not restricted to this but correction may be performed in the lithography process while regarding that the quantity of E-L shift results from only offset and scaling remarkably influencing misalignment. Thus, factor analysis and numerical input in the exposure apparatus can be simplified without substantially reducing alignment accuracy. The quantity of E-L shift may alternatively be regarded as resulting from only scaling remarkably influencing misalignment, for performing correction in the lithography process. Thus, factor analysis and numerical input in the exposure apparatus can be simplified without substantially reducing alignment accuracy. Further alternatively, the quantity of E-L shift may be regarded as resulting from only offset remarkably influencing misalignment, for performing correction in the lithography process. Also in this case, factor analysis and numerical input in the exposure apparatus can be simplified without substantially reducing alignment accuracy.

While the lithography process and the etching process are continuously carried out in the aforementioned embodiment, the present invention is not restricted to this but an ion implantation process, a heat treatment process and a cleaning process may be present between the lithography process and the etching process.

While the connection plugs for the lower semiconductor element patterns 8 and the upper semiconductor element patterns 9 are simultaneously formed in the aforementioned embodiment, the present invention is not restricted to this but the connection plugs may alternatively be formed by a tungsten etch back method, for example, for thereafter connecting the upper semiconductor element patterns 9 to the connection plugs.

While precedent processing is performed on the pilot wafer in the aforementioned embodiment, the present invention is not restricted to this but the factors for and the quantity of E-L shift in the precedent lot may be applied to the current lot while applying results of factor analysis for the current lot to the next lot without performing precedent processing on the pilot wafer.

The pilot wafer may alternatively be precedently processed up to the etching process for thereafter calculating the factors for and the quantity of E-L shift in the lithography process for the current lot and thereafter applying these values to the current lot.

What is claimed is:

1. A method of fabricating a semiconductor device comprising:

a first lithography step of transferring a mask pattern onto a first semiconductor substrate as a first resist pattern with positional reference to a first alignment mark;

a first etching step of performing etching through said first resist pattern serving as a mask;

a step of measuring the quantity of misalignment after said first etching step; and a second lithography step of thereafter transferring said mask pattern onto a second semiconductor substrate as a second resist pattern while correcting the positional reference based on said first alignment mark on the basis of the quantity of misalignment after said first etching step.

2. The method of fabricating a semiconductor device according to claim 1, further comprising a second etching step of performing etching through said second resist pattern serving as a mask.

3. The method of fabricating a semiconductor device according to claim 1, wherein said first etching step includes a step of forming a second alignment mark by etching, and said step of measuring the quantity of misalignment after said first etching step includes a step of measuring the quantity of misalignment between said first alignment mark and said second alignment mark after said first etching step.

4. The method of fabricating a semiconductor device according to claim 3, wherein said step of measuring the quantity of misalignment after said first etching step includes steps of:

analyzing the factor for the quantity of misalignment in said first lithography step, analyzing the factor for the quantity of misalignment in said first etching step, and calculating the quantity of misalignment after said first etching step by obtaining the difference between the factor for the quantity of misalignment in said first etching step and the factor for the quantity of misalignment in said first lithography step.

5. The method of fabricating a semiconductor device according to claim 4, wherein said factor for the quantity of misalignment includes at least one of offset, scaling and rotation.

6. The method of fabricating a semiconductor device according to claim 1, wherein said second lithography step includes a step of transferring said mask pattern onto a second semiconductor substrate as a second resist pattern while regularly setting the quantity of misalignment after said first etching step constant and correcting the positional reference based on said first alignment mark.

7. The method of fabricating a semiconductor device according to claim 1, wherein said second lithography step includes a step of correcting the positional reference based on said first alignment mark while regarding offset and scaling as the factors for the quantity of misalignment after said first etching step.

8. The method of fabricating a semiconductor device according to claim 1, wherein said second lithography step includes a step of correcting the positional reference based on said first alignment mark while regarding scaling as the factor for the quantity of misalignment after said first etching step.

9. The method of fabricating a semiconductor device according to claim 1, wherein said second lithography step includes a step of correcting the positional reference based on said first alignment mark while regarding offset as the factor for the quantity of misalignment after said first etching step.

10. The method of fabricating a semiconductor device according to claim 1, further comprising a step of forming a metal layer to cover said first alignment mark in advance of said first lithography step, wherein said first lithography step includes a step of transferring said mask pattern onto said metal layer as said first resist pattern.

11. The method of fabricating a semiconductor device according to claim 10, wherein said step of forming said metal layer includes a step of forming an asymmetrical metal layer by sputtering.

12. The method of fabricating a semiconductor device according to claim 2, wherein said lithography step includes a step of forming said second resist pattern on a region formed with said first alignment mark, and said second etching step includes a step of forming a second alignment mark by performing etching through said second resist pattern serving as a mask.

13. The method of fabricating a semiconductor device according to claim 1, wherein said first lithography step and said first etching step are carried out in a first lot, and said second lithography step is carried out in a second lot following said first lot.

14. The method of fabricating a semiconductor device according to claim 1, wherein said first lithography step and said first etching step are carried out on a pilot wafer for preprocessing, and said second lithography step is carried out in a first lot.

* * * * *